(12) United States Patent
Redecker et al.

(10) Patent No.: US 7,838,871 B2
(45) Date of Patent: Nov. 23, 2010

(54) ORGANIC FIELD-EFFECT TRANSISTOR, FLAT PANEL DISPLAY DEVICE INCLUDING THE SAME, AND A METHOD OF MANUFACTURING THE ORGANIC FIELD-EFFECT TRANSISTOR

(75) Inventors: Michael Redecker, Berlin (DE); Joerg Fischer, Berlin (DE); Arthur Mathea, Berlin (DE)

(73) Assignee: Samsung Mobile Display Co., Ltd., Yongin (KR)

( * ) Notice: Subject to any disclaimer, the term of this patent is extended or adjusted under 35 U.S.C. 154(b) by 56 days.

(21) Appl. No.: 11/061,459

(22) Filed: Feb. 22, 2005

(65) Prior Publication Data

US 2005/0211976 A1 Sep. 29, 2005

(30) Foreign Application Priority Data

Mar. 24, 2004 (EP) ................................. 04090119
Aug. 18, 2004 (KR) ..................... 10-2004-0065000

(51) Int. Cl.
*H01L 35/24* (2006.01)

(52) U.S. Cl. ............................ 257/40; 257/200; 257/79; 257/103

(58) Field of Classification Search .................... 257/40, 257/79, 103, 200
See application file for complete search history.

(56) References Cited

U.S. PATENT DOCUMENTS

| H655 H | * | 7/1989 | Ackermann | 257/395 |
|---|---|---|---|---|
| 6,207,472 B1 | | 3/2001 | Callegari et al. | 438/99 |
| 6,232,157 B1 | | 5/2001 | Dodabalapur et al. | 438/158 |
| 6,278,127 B1 | | 8/2001 | Dodabalapur et al. | |
| 6,312,304 B1 | * | 11/2001 | Duthaler et al. | 445/24 |
| 2001/0024860 A1 | * | 9/2001 | Park et al. | 438/287 |
| 2002/0195644 A1 | | 12/2002 | Dodabalapur et al. | 257/314 |
| 2004/0108562 A1 | * | 6/2004 | Nagayama et al. | 257/434 |
| 2004/0155276 A1 | * | 8/2004 | Iwasaki et al. | 257/301 |
| 2006/0054597 A1 | * | 3/2006 | Perng et al. | 216/83 |

FOREIGN PATENT DOCUMENTS

| EP | 1 398 840 A2 | 3/2004 |
|---|---|---|
| JP | 2003-324202 | 11/2003 |
| JP | 2004-031801 | 1/2004 |
| JP | 2004-55649 | 2/2004 |

(Continued)

OTHER PUBLICATIONS

"Junction Field-Effect Transistor Using Polythiophene as an Active Component" S. Miyauchi, et al.; Synthetic Metals, Elsevier Sequoia, 41-43 (1991) 1155-1158.

(Continued)

*Primary Examiner*—Long Pham
(74) *Attorney, Agent, or Firm*—H.C. Park & Associates, PLC

(57) ABSTRACT

An organic-field effect transistor, a method of manufacturing the same, and a flat panel display device including the organic-field effect transistor. The organic-field effect transistor includes an organic semiconductor layer, a gate electrode, and a charge carrier blocking layer. The charge carrier blocking layer is interposed between the gate electrode and the organic semiconductor layer, and it comprises a semiconducting material.

16 Claims, 3 Drawing Sheets

FOREIGN PATENT DOCUMENTS

| | | |
|---|---|---|
| JP | 2004-063978 | 2/2004 |
| WO | 03/023877 | 3/2003 |
| WO | WO 03/028125 A2 | 4/2003 |

OTHER PUBLICATIONS

Kazuhiro Kudo, et al., "Schottky gate static induction transistor using copper phthalocyanine films", Thin Solid Films 331, p. 51-54, 1998.

X. Zhou, et al., "High-efficiency electrophosphorescent organic light-emitting diodes with double light-emitting layers", Applied Physics Letters, vol. 81, No. 21, p. 4070-4072, Nov. 18, 2002.

C.D. Dimitrakopoulos, et al., "Low-Voltage Organic Transistors on Plastic Comprising High-Dielectric Constant Gate Insulators", Science, vol. 283, p. 22-24, Feb. 5, 1999.

Second Office Action issued Jan. 22, 2010 by the State Intellectual Property Office of the People's Republic of China in Chinese Application No. 200510055145.2.

Guangming, Wang, et al., "Poly (3-hexilthiophene) Field-Effect Transistors with High Dielectric Constant Gate Insulator", Journal of Applied Physics, vol. 95, No. 1, Jan. 1, 2004, pp. 316-322.

* cited by examiner

ORGANIC FIELD-EFFECT TRANSISTOR, FLAT PANEL DISPLAY DEVICE INCLUDING THE SAME, AND A METHOD OF MANUFACTURING THE ORGANIC FIELD-EFFECT TRANSISTOR

CROSS REFERENCE TO RELATED APPLICATION

This application claims priority to and the benefit of European Patent Application No. 04090119.1, filed on Mar. 24, 2004, and Korean Patent Application No. 10-2004-0065000, filed on Aug. 18, 2004, which are hereby incorporated by reference for all purposes as if fully set forth herein.

BACKGROUND OF THE INVENTION

1. Field of the Invention

The present invention relates to an organic field-effect transistor and a method of manufacturing the same.

2. Discussion of the Background

Generally, in the field of organic electronics, organic field-effect transistors and organic display elements, such as organic emission diodes, are subjects of interest because they may be used in single electronic circuits that may be produced without sophisticated semiconductor fabrication processes. In particular, single circuits based on organic and polymer semiconductors may be used for large-surface displays and transponders.

P-type and n-type semiconducting materials may be defined differently in organic electronics than in inorganic semiconductors, such as silicon, where, generally, a type of dopant defines semiconductor conductivity. In organic semiconductors, however, p-conductivity and n-conductivity relate to the polarity of a high mobility charge carrier. An electron has high mobility in an n-conducting semiconductor, and a defect electron (hole) has high mobility in a p-conducting semiconductor. A dopant having the polarity of excess charge carriers may be used in a conventional organic emission diode, but using such a dopant in an organic semiconductor may be difficult (Zhou et. al, Appl. Lett. 81, pp. 4070, 2002).

In organic field-effect transistors, an organic semiconductor material is disposed between a source electrode and a drain electrode. Applying a sufficient voltage to a gate electrode forms an electric field in a channel region between the source and drain electrodes. As a result, charge carriers (electrons or holes) flow into the channel, thus increasing conductivity in it. The channel may be formed by holes in a p-type transistor or by electrons in an n-type transistor. Therefore, a gate voltage may control transistors.

When counter charges migrate from the gate electrode to the channel, the electric field deteriorates, ultimately resulting in decreased functionality of the transistor structure. In order to prevent this problem, a charge carrier blocking layer (dielectric layer) may be interposed between the channel and the gate electrode.

However, an organic transistor including the charge carrier blocking layer may have a low maximum attainable current. Generally, the maximum attainable current is a critical factor for organic transistors, particularly in active matrix organic light emission devices.

The maximum attainable current depends on the length and width of the conductive channel, which may be composed of an inorganic and semiconducting material, and on the charge carrier mobility in the organic semiconductor.

To obtain the maximum attainable current, the channel should be short, wide and have high charge carrier mobility. However, there is a limit to the structural dimensions. Additionally, a surface capacity Ci of the dielectric should be considered to obtain the maximum attainable current. Also, a high capacity may be required in semiconductors to keep a sufficient density at a low gate voltage (VGS).

The following formula shows a correlation between an attainable current I and important parameters in an organic field-effect transistor's linear operation range:

$$I = \frac{C_i \cdot W}{L} \cdot \mu \cdot \left(V_{GS} - V_{th} - \frac{V_{DS}}{2}\right) \cdot V_{DS},$$

where $V_{th}$ is a transistor threshold voltage, $V_{DS}$ is a voltage applied between a drain contact and a source contact, $V_{GS}$ is a gate voltage, and $\mu$ is the charge carrier mobility.

According to this formula, the surface capacity Ci and the charge carrier mobility $\mu$ should have large values in order to obtain high maximum attainable current.

When channel thickness decreases, the surface capacity Ci increases. However, reducing the thickness of the charge carrier-blocking layer is particularly limited by hole density and a disruptive discharge voltage.

Additionally, a dielectric with a relatively high dielectric constant may be used to increase a switchable current in organic field-effect transistors (Dimitrakopoulos et al., Science 283(1999), pp. 822). In this case, the dielectric may be composed of a ferro-electric inorganic material, such as barium zirconium titanate. Such commonly used dielectric materials may be coated by sputtering. However, sputtering may require relatively high input energy and temperatures.

There may also be difficulties in using sputtering to form an organic functional layer, such as a channel composed of an organic semiconducting material. While sputtering may be used to form an organic semiconductor and other organic functional layers that may be formed in a final manufacturing process, it may not be possible to use a top gate structure.

FIG. 1 is a sectional view showing a conventional organic field-effect transistor. Referring to FIG. 1, a source electrode 2 and a drain electrode 6 are deposited on a substrate 1, and an organic semiconductor layer 3 is deposited on the source electrode 2 and the drain electrode 6. A charge carrier blocking layer 4 is deposited on the organic semiconductor layer 3, and a gate electrode 5 is deposited on the charge carrier blocking layer 4.

The organic semiconductor layer 3 may be composed of a p-conducting material. When a sufficient voltage is applied to the gate electrode 5, charge carriers 7 (holes) move into a channel formed between the drain electrode 6 and the source electrode 2 in the organic semiconductor layer 3. As a result, the channel may have high conductivity. Therefore, applying a voltage to the gate electrode 5 may control the transistor.

However, hole density and a disruptive discharge voltage may limit the minimum possible thickness of the charge carrier blocking layer 4.

Furthermore, depositing a ferro-electric inorganic material, including barium zirconium titanate (BZT), on the organic semiconductor layer 3 to form the charge carrier blocking layer 4 may require a high temperature with a high energy input. Therefore, directly depositing the ferro-electric inorganic material on the organic semiconductor layer 3 may damage it.

Since a minimum thickness of the charge carrier blocking layer 4 may not be decreased independently, and depositing the charge carrier blocking layer 4 on the organic semiconductor layer 3 may damage it, the maximum attainable current of a conventional organic field-effect transistor and application of the organic field-effect transistor with pre-specified structural dimensions may be very limited.

SUMMARY OF THE INVENTION

The present invention provides an organic field-effect transistor having a high maximum switchable current with pre-specified structural dimensions, and a flat display device including the same.

The present invention also provides a method of manufacturing the organic field-effect transistor. In particular, the charge carrier blocking layer may be deposited using thermal deposition or electron beam deposition.

Additional features of the invention will be set forth in the description which follows, and in part will be apparent from the description, or may be learned by practice of the invention.

The present invention discloses an organic field-effect transistor including an organic semiconductor layer, a gate electrode, and a charge carrier blocking layer interposed between the gate electrode and the organic semiconductor layer. The charge carrier blocking layer comprises a semiconducting material.

The present invention also discloses an organic field-effect transistor including a charge carrier blocking layer comprising a semiconducting material, and a flat panel display device including the same.

The present invention also discloses a method of manufacturing an organic field-effect transistor including forming an organic semiconductor layer, forming a gate electrode, and depositing a charge carrier blocking layer in between the organic semiconductor layer and the gate electrode. The charge carrier blocking layer is deposited by thermal deposition or electron beam deposition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
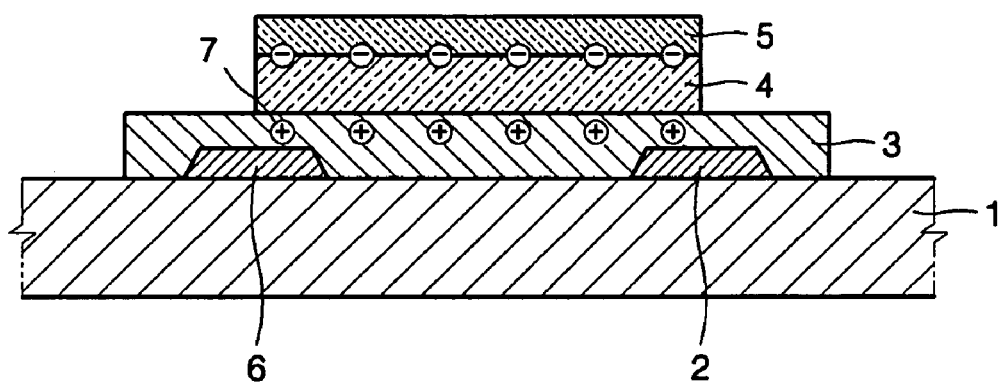
FIG. 1 is a sectional view showing a conventional organic field-effect transistor.

An organic field-effect transistor with a p-channel according to an exemplary embodiment of the present invention will now be described.

A conduction band energy of the charge carrier blocking layer may be less than a work function of the gate electrode, and a conduction band energy of the organic semiconductor layer may be greater than the conduction band energy of the charge carrier blocking layer, which comprises a semiconducting material. Further, a valence band energy of the charge carrier blocking layer may be less than that of the organic semiconductor layer. In particular, an energy barrier between the conduction band of the charge carrier blocking layer and the conduction band of the organic semiconductor layer, and an energy barrier between the valence band of the charge carrier blocking layer and the valence band of the organic semiconductor layer, may be greater than 1.0 eV. An energy barrier between the conduction band of the charge carrier blocking layer and the work function of the gate electrode may be less than 0.2 eV.

Properly selecting a material comprising the gate electrode, the organic semiconductor layer, and the charge carrier blocking layer may permit injection and/or migration of electrons into the charge carrier blocking layer up to an interface between the charge carrier blocking layer and the organic semiconductor layer. In this case, the charge carrier blocking layer may comprise an n-conducting material, and the organic semiconductor layer (channel) may comprise a p-conducting material.

Alternatively, an equivalent structure may be obtained when the charge carrier blocking layer comprises a p-conducting material and the semiconductor layer comprises an n-conducting material. In this case, a work function of a gate contact may be equal to or similar to a valence band energy of the charge carrier blocking layer. Defect electrons (holes) may be injected into the charge carrier blocking layer. In order to prevent charge carriers from overspilling from the charge carrier blocking layer into the n-channel, a valence band energy of the charge carrier blocking layer may be at least 1 eV larger than a valence band energy of the organic semiconductor layer.

Also, a conduction band energy of the charge carrier blocking layer may be 1 eV larger than a conduction band energy of the organic semiconductor layer.

When the organic field-effect transistor is a p-channel transistor, the organic semiconductor layer may comprise pentacenes, tetracenes, phtalocyanines with a low output work function, oligothiophenes, -(oligo-) and polyarylamines, polyalkylthiophenes, copolymers of alkylfluorene units and alkylthiophenes, polyfluorenes, poly(thienylene vinylenes), poly(phenylene vinylenes), and/or homopolymers of phenylene, or -(napthalene-) and/or anthranyl units.

The charge carrier blocking layer may comprise an inorganic material or an organic material. The inorganic material may be at least one element selected from titanium oxide, undoped tin oxide, undoped zinc oxide, zirconium dioxide, tantalum oxide, and zinc sulphide. The organic material may be at least one element selected from derivatives of perylene tetra carboxylic acid diimide or naphthalene tetra carboxylic acid diimide.

The gate electrode in a p-conducting field-effect transistor may comprise at least one element selected from scandium and yttrium, Mg, an alloy of Ag and Mg, Ca, Ba and lanthanides. The lanthanides may include cerium or ytterbium. Additionally, the source electrode or the drain electrode may comprise at least one element selected from the group consisting of Au, Pd, Pt, and a conducting polymer. The conducting polymer may comprise poly(ethylene dioxithiophene)/polystyrene sulfone acid.

In the alloy of Ag and Mg, the Mg and Ag may be mixed in a weight ratio of 1:9.

When the organic field-effect transistor is an n-channel transistor, the organic semiconductor layer may comprise a derivative of perylene tetra carboxylic acid diimide, naphthaline tetra carboxylic acid diimide, or a fullerene. The charge carrier blocking layer may comprise an oligomer arylamine derivative. The gate electrode may comprise at least one element selected from Au, Pd, Pt, and Ni. Additionally, the source electrode or the drain electrode may comprise at least one element selected from the group consisting of Al, Ti, Mg, and Ag.

When a p-conducting channel (a portion of the organic semiconductor layer between the drain electrode and the source electrode) and an n-conducting charge carrier blocking layer are formed using the materials above, negative charge carriers (electrons) may be injected into the charge carrier blocking layer. Further, electrons may migrate to an interface between the n-conducting charge carrier blocking layer and the p-conducting channel. As a result, according to exemplary embodiments of the present invention, an effective thickness of the charge carrier blocking layer may be substantially decreased, thus resulting in an increased maximum attainable current of the organic field-effect transistor.

Figure 2:
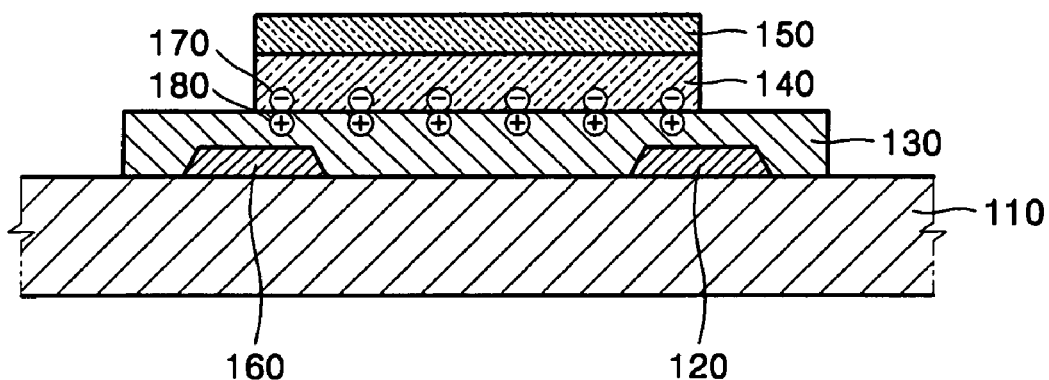
FIG. 2 is a sectional view of a p-channel organic field-effect transistor according to an exemplary embodiment of the present invention.

FIG. 2 is a sectional view showing an organic field-effect transistor according to an exemplary embodiment of the present invention. The organic field-effect transistor differs from a conventional organic field-effect transistor in that a charge carrier blocking layer 140 comprises a semiconducting material. In this structure, charge carriers (electrons) 170 may be injected into the charge carrier blocking layer 140 and migrate to an interface between the charge carrier blocking layer 140 and an organic semiconductor layer 130. Therefore, the charge carrier blocking layer 140 may have a substantially smaller effective thickness, resulting in an increased maximum attainable current in the organic field-effect transistor. Electrons may be injected into the charge carrier blocking layer 140 when a small barrier exists to the injection of charge carriers into the charge carrier blocking layer 140. Additionally, in order to maintain a low-level gate leak rate of the organic field-effect transistor, a large barrier may prevent excess charge carriers from moving from the charge carrier blocking layer 140 to the organic semiconductor layer 130 and from the organic semiconductor layer 130 to the charge carrier blocking layer 140.

Appropriately selecting a gate electrode 150, the charge carrier blocking layer 140, and the organic semiconductor layer 130 may satisfy the above-mentioned conditions.

The organic field-effect transistor according to an exemplary embodiment of the present embodiment may include a substrate 110, which may be a substrate used for other components, such as an organic light emission display. Source and drain electrodes 120, 160 may be formed on the substrate 110, and the organic semiconductor layer 130 may cover them.

Figure 3A:
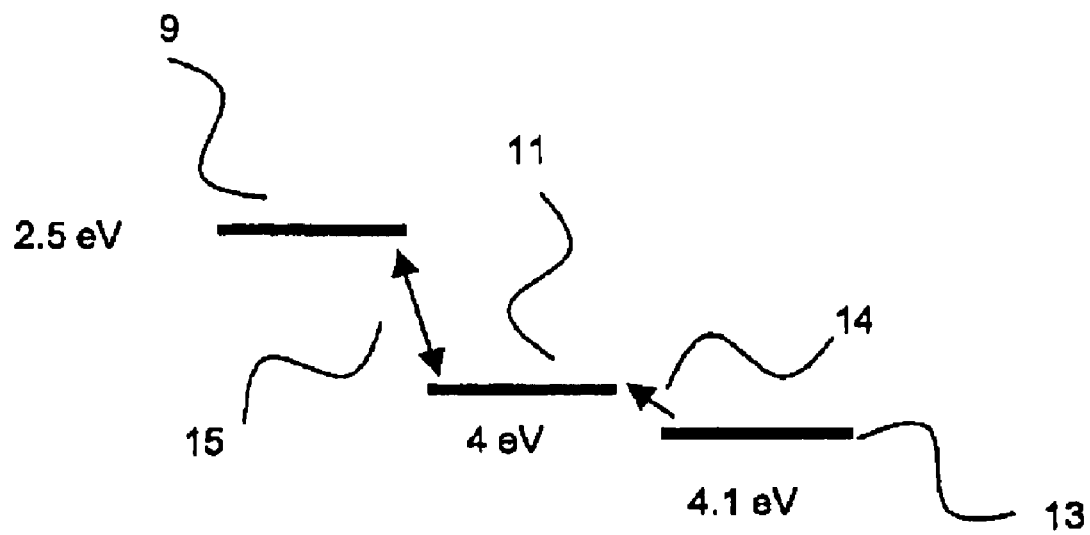
FIG. 3A and FIG. 3B are diagrams showing energy levels of the p-channel transistor shown in FIG. 2.
Figure 3B:
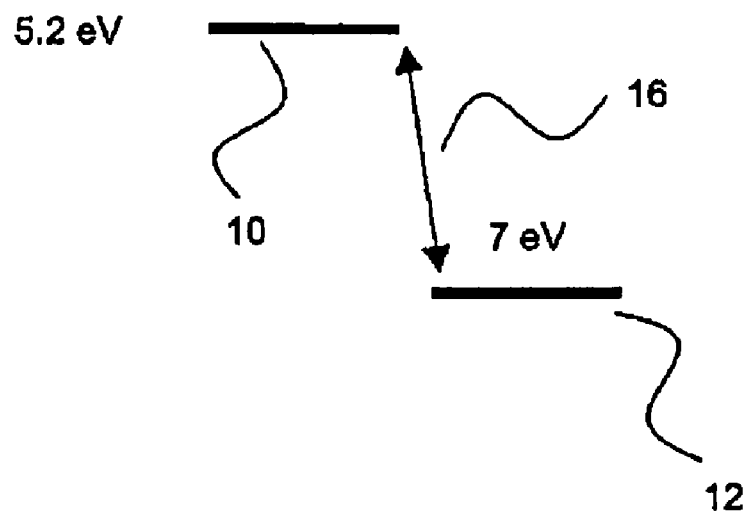

FIG. 3A and FIG. 3B are energy diagrams of the organic field-effect transistor shown in FIG. 2. The energy diagrams apply for a de-energized and off-circuit state in which no band distortions occur from charge carrier accumulation. The energy levels shown in FIG. 3A and FIG. 3B are of a p-conducting organic semiconductor layer 130 and of a n-conducting charge carrier blocking layer 140.

Alternatively, if the proper materials are selected, the organic semiconductor material 130 may comprise n-conducting material and the charge carrier blocking layer 140 may comprise p-conducting material.

In the present exemplary embodiment shown in FIG. 3A and FIG. 3B, the organic semiconductor layer 130 comprises polyalkythiophene, the charge carrier blocking layer 140 comprises titanium oxide, and the gate electrode 150 comprises an alloy of Mg and Ag. Electrons are injected from a gate level 13 to a conduction band 11 of the charge carrier blocking layer 140 through an energy barrier 14 of 0.1 eV. Although the injected electrons may migrate to the interface between the charge carrier blocking layer 140 and the organic semiconductor layer 130, an energy barrier 15 of 1.5 eV may prevent them from overspilling to a conduction band 9 of the organic semiconductor layer 130. Likewise, an energy barrier 16 of 1.8 eV may prevent holes 180 (defect electrons) from a valance band 10 of the organic semiconductor layer 130 from overspilling to a valance band 12 of the charge carrier blocking layer 140.

When the charge carrier blocking layer 140 comprises titanium oxide, the gate electrode 150 may comprise a base metal with a work function in the range of about 3.8 eV to about 4.0 eV.

In order for the charge carriers to be injected into the charge carrier blocking layer 140, the energy barrier 14 may be equal to or less than 0.2 eV, which must be considered when selecting material for the gate electrode 150.

A method of manufacturing an organic field-effect transistor according to an exemplary embodiment of the present invention includes depositing a source electrode and a drain electrode on a substrate, depositing an organic semiconductor layer on the source and drain electrodes, depositing a charge carrier blocking layer on the organic semiconductor layer, and depositing a gate electrode on the charge carrier blocking layer. The charge carrier blocking layer 140 may be deposited using thermal deposition or electron beam deposition.

Conventionally, a high dielectric constant material, such as an inorganic ferro-dielectric, is used for the charge carrier blocking layer 140 to obtain a maximum obtainable current. On the other hand, a semiconducting material, which may be used to form the charge carrier blocking layer 140 according to exemplary embodiments of the present invention, may be deposited using thermal deposition or electron beam deposition in a vacuum.

Therefore, high energy input and/or high thermal stress on the organic semiconductor layer 130 may be avoided. Consequently, deposition of an organic functional layer in a final manufacturing process may be avoided. This may allow formation of a top-gate structure transistor.

For this purpose, in a method of manufacturing the p-channel transistor according to an exemplary embodiment of the present invention, the charge carrier blocking layer 140 may comprise a semiconductor material, such as titanium oxide. The electron beam deposition may be performed under oxygen with a partial pressure of about $10^{-4}$ to about $10^{-3}$ mbar.

Hereinafter, a flat display device including an organic field-effect transistor layer having the organic field-effect transistor according to an exemplary embodiment of the present invention will be described.

Figure 4:
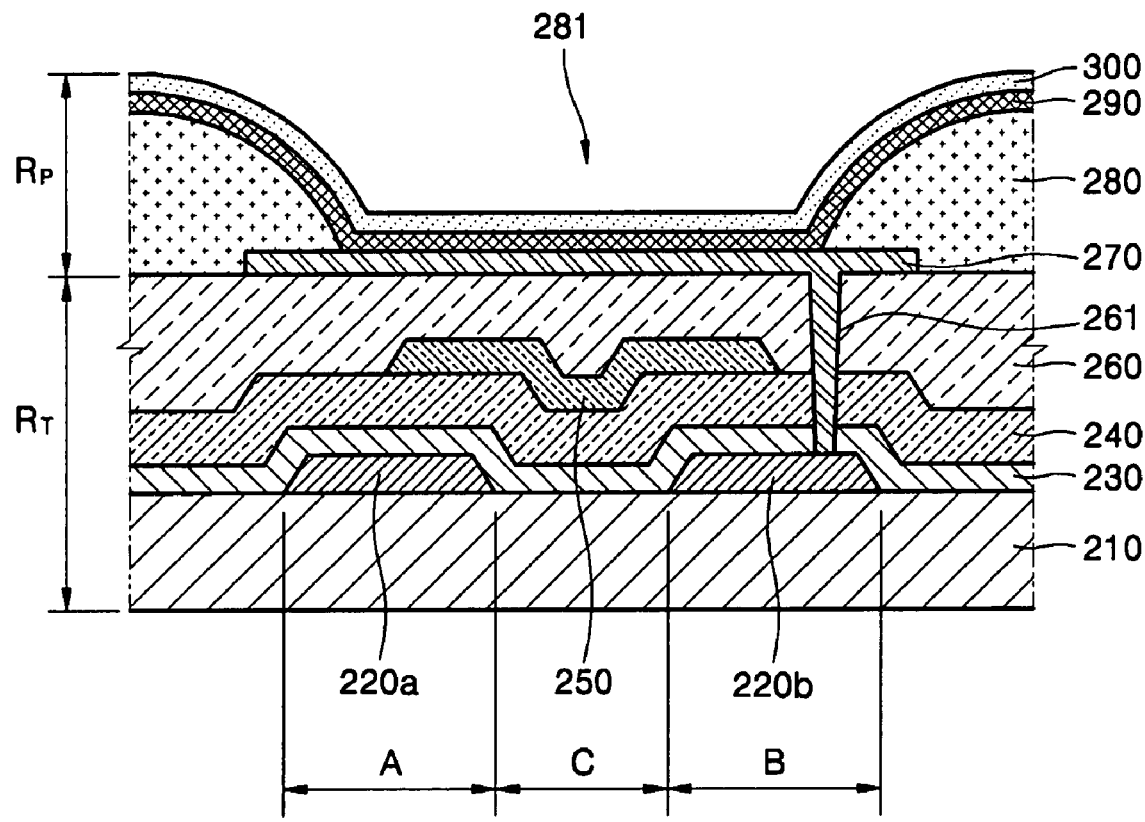
FIG. 4 is a sectional view showing a pixel of an organic light emission display according to an exemplary embodiment of the present invention.

FIG. 4 is a sectional view showing a pixel of an organoelectric light emission display device according to an exemplary embodiment of the present invention.

Referring to FIG. 4, an organic field-effect transistor layer RT including an organic field-effect transistor may be formed on a substrate 210, which may be made of glass. The organic field-effect transistor may be formed in the same manner as in the previous exemplary embodiment. First, a source electrode 220a and a drain electrode 220b may be formed on the substrate 210. An organic semiconductor layer 230, comprising a source region A, a drain region B, and a channel region C, may be formed on the source electrode 220a and the drain electrode 220b. A gate electrode 250 may be formed over and crossed with at least the channel region C of the organic semiconductor layer 230. A charge carrier blocking layer 240 is interposed between the organic semiconductor layer 230 and the gate electrode 250.

An insulator 260 may be formed on the gate electrode 250 to planarize and/or to insulate lower layers. The insulator 260 may comprise an inorganic material, such as SiNx. Additionally, an organic material, such as benzocyclobutene (BCB) or aryl, may be further formed on the inorganic material, as part of the insulator 260, which may be single or multi-layered.

A pixel layer $R_P$ may be formed on the organic field-effect transistor layer $R_T$. The pixel layer $R_P$ includes at least a pixel. Each pixel may include a first electrode layer 270, a second electrode layer 300, and an organoelectric emission unit 290 interposed therebetween.

The first electrode layer 270 may be formed on the insulator 260, and it may be coupled to the drain electrode 220b through a via hole 261. A pixel defining layer 280 may be formed by spin coating on the first electrode layer 270. Next, a pixel opening 281 may be formed by patterning the pixel defining layer 280. The organoelectric emission unit 290 may then be formed on at least the first electrode layer 270. Finally, the second electrode layer 300 may be formed on the organoelectric emission unit 290.

The first electrode layer 270 and the second electrode layer 300 may comprise at least an element selected from ITO, Al, and Mg-Ag. The elements comprising the first electrode layer 270 and the second electrode layer 300 depend on the emission type of the display device, such as a front or rear surface emission type. The organoelectric emission unit 290 may comprise a low molecular weight organic layer or a polymer organic layer. When the organoelectric emission unit 290 comprises a low molecular weight organic layer, it may include a hole injection layer (HIL), a hole transport layer (HTL), an organic emission layer (EML), an electron transport layer (ETL), an electron injection layer (EIL), or the like. The organoelectric emission unit 290 may be a single layer or a multi layer. Examples of the low molecular weight organic material include copper phthalocyanine (CuPc), N,N'-di(naphthalene-1-yl)-N,N'-diphenyl-benzidine (NPB), tris-8-hydroxyquinoline aluminum(Alq3), and the like. The low molecular weight organic layer may be formed by vacuum deposition.

When the organoelectric emission unit 290 comprises a polymer organic material, it may include an HTL and an EML. In this case, the HTL may comprise polyethylenethioxythiophene (PEDOT). The EML may comprise a polyphenylenevinylene (PPVs) or a polyfluorene. The HTL and the EML may be formed by screen printing or inkjet printing.

An organic field-effect transistor according to exemplary embodiments of the present invention may be used in various electronic devices, including electronic paper, smart cards, RF tags, rollup displays, PDAs, and the like, as well as flat panel display devices.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic field-effect transistor, comprising:
   an organic semiconductor layer;
   a source electrode and a drain electrode contacting the organic semiconductor layer;
   a gate electrode; and
   a charge carrier blocking layer separating the organic semiconductor layer, the source electrode, and the drain electrode from the gate electrode,
   wherein the charge carrier blocking layer comprises at least one of undoped tin oxide, undoped zinc oxide, and oligomer arylamine derivative,
   wherein the organic semiconductor layer comprises a p-type semiconducting material,
   wherein at least one of the source electrode and the drain electrode comprises at least one element selected from the group consisting of Au, Pd, Pt, and a conducting polymer, and
   wherein the conducting polymer is poly(ethylene dioxithiophene)/polystyrene sulfone acid.

2. The organic field-effect transistor of claim 1, wherein the charge carrier blocking layer consists of undoped tin oxide, undoped zinc oxide, or oligomer arylamine derivative.

3. The organic field-effect transistor of claim 1,
   wherein a conduction band energy of the charge carrier blocking layer is less than a work function of the gate electrode, and
   wherein a conduction band energy of the organic semiconductor layer is greater than the conduction band energy of the charge carrier blocking layer.

4. The organic field-effect transistor of claim 3, wherein an energy barrier between the charge carrier blocking layer and the organic semiconductor layer is greater than 1.0 eV.

5. The organic field-effect transistor of claim 4, wherein the energy barrier between the charge carrier blocking layer and the organic semiconductor layer is 1.5 eV.

6. The organic field-effect transistor of claim 3, wherein an energy barrier between the conduction band energy of the charge carrier blocking layer and the work function of the gate electrode is less than 0.2 eV.

7. The organic field-effect transistor of claim 6, wherein the energy barrier between the conduction band energy of the charge carrier blocking layer and the work function of the gate electrode is 0.1 eV.

8. The organic field-effect transistor of claim 1,
   wherein the charge carrier blocking layer comprises at least one element selected from the group consisting of undoped tin oxide and undoped zinc oxide.

9. An organic field-effect transistor, comprising:
   an organic semiconductor layer;
   a source electrode and a drain electrode contacting the organic semiconductor layer;
   a gate electrode; and
   a charge carrier blocking layer separating the organic semiconductor layer, the source electrode, and the drain electrode from the gate electrode,
   wherein the charge carrier blocking layer comprises a semiconducting material,
   wherein the organic semiconductor layer comprises an n-type semiconducting material; and
   wherein the charge carrier blocking layer comprises an oligomer arylamine derivative.

10. An organic field-effect transistor, comprising:
    an organic semiconductor layer;
    a gate electrode; and
    a charge carrier blocking layer interposed between the gate electrode and the organic semiconductor layer,
    wherein the charge carrier blocking layer comprises a semiconducting material;
    wherein the organic semiconductor layer comprises a p-type semiconducting material; and
    wherein the gate electrode comprises at least one element selected from the group consisting of Mg, an alloy of Mg and Ag, Ca, Ba, and a lanthanide.

11. The organic field-effect transistor of claim 9,
wherein the organic semiconductor layer comprises an n-type semiconducting material; and
wherein the gate electrode comprises at least one element selected from the group consisting of Au, Ni, Pd, and Pt.

12. The organic field-effect transistor of claim 10, wherein the lanthanide is cerium or ytterbium.

13. The organic field-effect transistor of claim 10, wherein the alloy of Mg and Ag is prepared by mixing Mg and Ag in a weight ratio of 1:9.

14. The organic field-effect transistor of claim 9, further comprising:
a source electrode and a drain electrode,
wherein the organic semiconductor layer is an n-type semiconducting material, and
wherein at least one of the source electrode and the drain electrode comprises at least one element selected from the group consisting of Al, Ti, Mg, and Ag.

15. A flat panel display device, comprising:
a substrate;
an organic field-effect transistor layer formed on the substrate and comprising:
an organic semiconductor layer;
a source electrode and a drain electrode contacting the organic semiconductor layer;
a gate electrode; and
a charge carrier blocking layer comprising at least one of undoped tin oxide, undoped zinc oxide, and oligomer arylamine derivative, and separating the organic semiconductor layer, the source electrode, and the drain electrode from the gate electrode; and
a pixel layer formed on the organic field-effect transistor layer,
wherein the pixel layer is coupled to the organic field-effect transistor layer and has a pixel,
wherein the organic semiconductor layer comprises a p-type semiconducting material,
wherein at least one of the source electrode and the drain electrode comprises at least one element selected from the group consisting of Au, Pd, Pt, and a conducting polymer, and
wherein the conducting polymer is poly(ethylene dioxithiophene)/polystyrene sulfone acid.

16. The flat panel display device of claim 15, wherein the pixel comprises:
a first electrode layer;
a second electrode layer; and
an organoelectric emission unit interposed between the first electrode layer and the second electrode layer.

* * * * *